United States Patent [19]
Hanford et al.

[11] Patent Number: 5,353,166
[45] Date of Patent: Oct. 4, 1994

[54] MOUNTING SYSTEM FOR OPTICAL ANNULUS IN LENS ASSEMBLY

[75] Inventors: Keith E. Hanford, Macedon; Edward A. Johnson, Churchville, both of N.Y.

[73] Assignee: General Signal Corporation, Stamford, Conn.

[21] Appl. No.: 957,524

[22] Filed: Oct. 6, 1992

Related U.S. Application Data

[63] Continuation-in-part of Ser. No. 787,785, Nov. 4, 1991, abandoned.

[51] Int. Cl.$^5$ .................................. G02B 7/02
[52] U.S. Cl. .................... 359/819; 359/808; 359/811
[58] Field of Search ............... 359/800–830, 359/872, 894, 896; 372/107; 40/651, 663, 664; 248/649–650, 473, 188.4

[56] References Cited

U.S. PATENT DOCUMENTS

| | | | |
|---|---|---|---|
| 2,529,894 | 11/1950 | Altman et al. | 359/823 |
| 3,578,407 | 5/1971 | Arnold et al. | 359/894 |
| 3,814,507 | 6/1974 | Osborn et al. | 359/819 |
| 4,436,375 | 3/1984 | Meginnis | 359/894 |
| 4,498,737 | 2/1985 | Doggett | 359/800 |
| 5,249,197 | 9/1993 | Kittell | 372/107 |

FOREIGN PATENT DOCUMENTS

| | | | |
|---|---|---|---|
| 205305 | 9/1987 | Japan | 359/896 |
| 316712 | 12/1989 | Japan | 359/899 |

OTHER PUBLICATIONS

*Opto-Mechanical Systems Design,* by Paul R. Yoder, Jr., Marcel Dekker, Inc., N.Y., 1986, including pp. 204–209.
"Precision Mechanics", by David Kittell, Short Course Notes, Stamford, Conn., 1989, presented in SPIE's International Conferences on Imaging, Fabrication, and Competitiveness in Optics, Rochester, N.Y., 1991, including pp. 14 and 45.

*Primary Examiner*—Loha Ben
*Assistant Examiner*—Thong Nguyen
*Attorney, Agent, or Firm*—Eugene Stephens & Associates

[57] ABSTRACT

An optical mounting system using interconnected annuli that support optical elements is made more accurate by forming raised engagement surfaces around the periphery of the annuli to confront and engage each other in a mounting plane perpendicular to the concentric axis of the annuli. The raised engagement surfaces are preferably formed as concentric ridge rings spaced radially inside and outside a row of screw holes used for interconnecting the annuli. The raised engagement surfaces are also preferably continuous around the peripheries of the annuli so they can be ground accurately flat and provide interannuli mounting surfaces that are resistant to deformation.

22 Claims, 1 Drawing Sheet though a wide range of engagement regions. It is also preferable that engagement surfaces 15 and 16 be raised above a recess 17 containing screw holes 20 and 25 by a few thousandths of an inch, which is enough to space the grinder well clear of recess 17 as the grinder engages ridge surfaces 15 and 16.

MOUNTING SYSTEM FOR OPTICAL ANNULUS IN LENS ASSEMBLY

RELATED APPLICATIONS

This application is a continuation-in-part of copending parent application Ser. No. 787,785, filed 4 November 1991, entitled DECOUPLED MOUNT FOR OPTICAL ELEMENT AND STACKED ANNULI ASSEMBLY, now abandoned. The entire disclosure of the pending parent application is hereby incorporated by reference into this application.

TECHNICAL FIELD

This invention involves precision mounts for elements in lens assemblies.

BACKGROUND

Ways of mounting optical elements within annular mounting rings and ways of stacking the rings to assemble a lens having a plurality of precisely mounted elements are explained in the parent application. This invention involves improvements in the annuli used in such a mounting system. It recognizes and provides a solution for a source of error occurring in the annuli as originally conceived and, by reducing such error, makes annulus mounted optical elements more accurate and improves the precision of lenses assembled by stacked annuli.

SUMMARY OF THE INVENTION

Our way of mounting an optical annulus supporting an optical element on its axis is to form a space pair of continuous engagement surfaces extending around the inner and outer periphery of the annulus, and raised so that the engagement surfaces are in a mounting plane clear of other portions of the annulus and perpendicular to its axis. The engagement surfaces have substantially constant widths throughout their continuous extent and are radially spaced to pass inside and outside of a ring of screw holes formed around the annulus to receive screws that mount it in place. Stacked annuli are formed in similar ways to have matching engagement surfaces that meet at each mounting plane and provide the only engagement between adjacent annuli. Such engagement surfaces can be ground precisely flat to minimize deformation that tends to occur when screws are used to mount an annulus in place. We also prefer that screw heads be countersunk deeply into each annulus and be threaded into the nearest available portion of an annulus, again to minimize deformations resulting from tightening the screws.

DRAWINGS

FIG. 1 is a partially cutaway and partially schematic view of a stacked optical annuli assembled with confronting engagement surfaces according to our invention; and FIG. 2 is a partially schematic plan view of an annulus having a preferred form of engagement surfaces according to our invention.

DETAILED DESCRIPTION

The parent application discloses a decoupled mounting system for optical elements and ways of arranging decoupled mounts within optical annuli that can be stacked together for supporting elements of a multi-element lens. The disclosure of the parent application is incorporated by reference into this application, and the details of the decoupled mount are not re-explained in this application. The structure relevant to this application is the body of the annulus and its configuration in an improved way for mounting the annulus reliably on a receiving surface such as the surface of another annulus.

Figure 1:
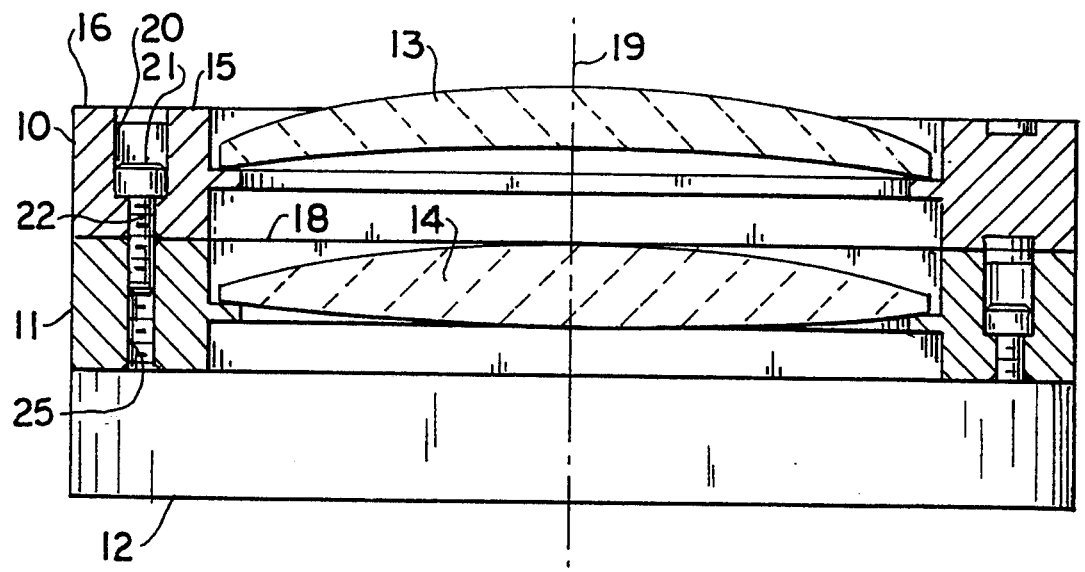
Figure 2:
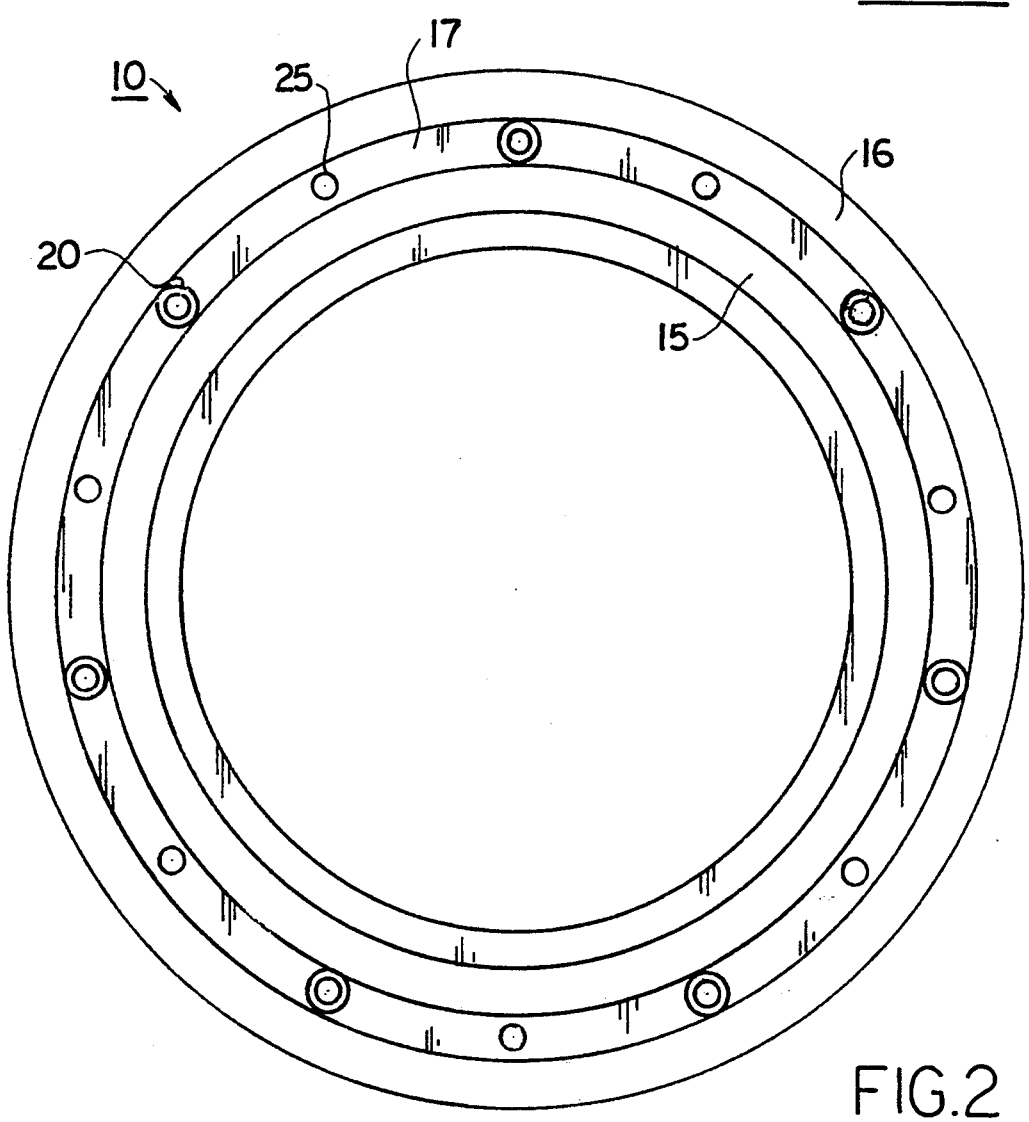

The annuli 10-12, shown in FIG. 1, generally have steel bodies that are ground as precisely as practically possible for accurately fitting together. Generally, each annulus supports an optical element such as one of the illustrated lens elements 13 or 14, although some annuli can serve as spacers; and optical elements other than lens elements can be supported by an annulus. Also, an annulus can be arranged to change a diameter of an annulus stack, so as to engage a smaller diameter annulus on one side and a larger diameter annulus on another side. Optical annuli for all these purposes preferably have bodies that are configured for interengagement as explained in this application.

We found in our preliminary work with optical annuli that grinding their plane interengagement surfaces produced tiny irregularities where the grinder passed over screw holes. The area of the annulus body work piece engaged by the grinder is less in the vicinity of a screw hole than it is elsewhere. This changes the resistance of the annulus body to the grinding force and results in a very shallow recess being formed in the annulus body surface in the vicinity of each screw hole. Then, when an annulus is screwed to a plane mounting surface, which is usually an adjacent annulus, the screw tension is able to deform the annulus body slightly at each screw location. This deformation is partially transmitted to the optical element supported within the annulus, thus reducing the optical accuracy of the mount.

Our solution to this problem is to form each annulus body with a pair of spaced apart engagement surfaces that are axially raised on opposite sides of the screw holes and have substantially constant widths around the periphery of an annulus. The engagement surfaces can then be ground accurately flat, without being affected by the presence of screw holes between them; and the engagement surfaces on each side of the screw holes can provide an accurate and stable support for the annulus body.

Our preferred form for such engagement surfaces is inner and outer concentric rings 15 and 16 extending around the perimeter of each annulus. Screw holes 20 and 25 are preferably arranged between these inner and outer engagement surfaces or rails of rings 15 and 16 in a shallow recess 17 formed between raised ridges of rings 15 and 16. The spacing between the ridges for rings 15 and 16 is preferably slightly more than the diameters of the larger screw holes 20 so that the rings 15 and 16 are as close to the screw holes as practical.

It is also possible for raised ridge surfaces 15 and 16 to have forms other than circular. For example, ridge rings 15 and 16 could curve together and meet between screw holes and separate to extend around screw holes. Such a configuration would be more difficult to machine and has no presently discernible advantage over the simple concentric ridge rings 15 and 16, which we prefer.

Ridge engagement surfaces 15 and 16 should also be continuous and uninterrupted around the periphery of an annulus, so as to offer continuously uniform pressure resistance to a grinder. This facilitates grinding engagement ridge surfaces 15 and 16 accurately flat throughout the periphery of an annulus and avoiding any departure from flatness that discontinuities tend to cause.

We prefer that the total width of engagement surfaces 15 and 16 be constant around the full angular extent of each annulus. This also is to ensure that engagement surfaces 15 and 16 offer continuous resistance to a grinder to facilitate accurately flat grinding. Varying the width of engagement surfaces 15 and 16 by 50 percents or more can introduce flatness errors into the grinding process so that we prefer holding any width variation in surfaces 15 and 16 to less than 50 percents. Machining surfaces 15 and 16 to have substantially uniform widths around the periphery of an annulus is also relatively easy to achieve.

The widths of raised engagement surfaces 15 and 16 are also preferably about equal. This affords a balanced and uniform stance in the mounting region where one annulus engages another. The mounting region is preferably a plane, such as plane 18 between annuli 10 and 11; and each interannular mounting plane 18 is preferably perpendicular to the concentric axis 19 of annuli 10-12. Slight departures from this can be deliberately made for specific circumstances, such as an annulus that changes a stack diameter and is thus cantilevered between larger and smaller diameter annuli, which tend to deform it into a conical shape. This can be counteracted by grinding engagement ridges 15 and 16 to slightly different levels opposite to the cantilevering effect.

We also prefer that screw holes 20, which receive the heads 21 of screws 22, be countersunk more than half way into each annulus so that screw heads 21 are disposed relatively close to the adjacent annulus into which they are threaded. We correspondingly prefer that screws 22 engage threaded screw holes 25 near the annulus or support surface that they enter. This is to dispose the stress from screw tension relatively close to the interengagement mounting plane 18. Since this stress tends to fan outward, keeping it close to the mounting plane reduces its affect.

We claim:

1. A system for mounting an optical annulus supporting an optical element on an axis of said annulus, said mounting system comprising:
   a. a pair of continuous engagement surfaces formed on spaced-apart inner and outer rings that extend concentrically around said annulus;
   b. said engagement surfaces being disposed in a mounting plane perpendicular to said axis of said annulus;
   c. all surfaces of said annulus except said engagement surfaces being disposed clear of said mounting plane;
   d. said engagement surfaces having substantially constant width throughout their continuous extent around said annulus;
   e. screw holes arranged around said annulus between said inner and outer rings to be clear of said engagement surfaces; and
   f. screws disposed in said screw holes for holding said engagement surfaces against a plane support, for mounting said annulus.

2. The mounting system of claim 1 wherein heads of said screws are countersunk more than half way into said annulus.

3. The mounting system of claim 1 wherein said engagement surfaces on said inner and outer rings have equal widths.

4. The mounting system of claim 1 wherein said rings are adjacent radially inner and outer edges of said screw holes.

5. The mounting system of claim 1 wherein said rings are formed on a pair of confronting optical annuli having respective engagement surfaces disposed to interengage each other in said mounting plane.

6. The mounting system of claim 1 wherein said plane support is a matching pair of concentric rings.

7. a mounting system for interconnecting a pair of coaxial optical annuli at least one of which coaxially holds an optical element, said mounting system comprising:
   a. each of said annuli having a spaced pair of engaging surfaces that are configured and ground so that each pair engages the other pair in a mounting plane perpendicular to an axis of said annuli;
   b. surfaces of said annuli apart from said engaging surfaces being spaced from said mounting plane;
   c. said engaging surfaces extending continuously around each of said annuli and being configured to engage each other continuously around the peripheries of said annuli;
   d. said engaging surfaces of each pair being separated to extend radially inside and radially outside of screws arranged around said annuli for interconnecting said annuli; and
   e. said engaging surfaces having an approximately constant total width.

8. The mounting system of claim 7 wherein said engaging surfaces are formed on inner and outer concentric rings.

9. The mounting system of claim 8 wherein said inner and outer engaging surfaces have approximately equal widths.

10. The mounting system of claim 7 wherein radially inner and outer ones of said engaging surfaces are separated from each other throughout the angular extent of said annuli.

11. A lens assembly formed of stacked coaxial annuli interconnected by screws and having interengagement surfaces meeting in planes extending between said annuli and perpendicular to an axis of said annuli, said lens assembly comprising:
   a. said interengagement surfaces being spaced apart on opposite sides of holes for said screws;
   b. said interengagement surfaces extending continuously around said annuli;
   c. said interengagement surfaces extending radially inside and outside of said holes for said screws;
   d. said interengagement surfaces having a total width that remains approximately constant around the radial extent of said annuli; and
   e. said interengagement surfaces being axially raised relative to other surfaces of said annuli.

12. The lens assembly of claim 11 wherein said interengagement surfaces are formed as concentric rings.

13. The lens assembly of claim 12 wherein said interengagement surfaces have substantially equal widths.

14. The lens assembly of claim 12 wherein said interengagement surfaces are spaced apart by slightly more than the diameters of said holes.

15. The lens assembly of claim 11 wherein said holes for receiving heads of screws are countersunk at least half way into said annuli.

16. The lens assembly of claim 11 wherein all regions of radially inner and outer ones of said interengagement surfaces are separated.

17. A mounting system for a lens assembly formed of coaxially arranged and interconnected annuli respectively supporting optical elements arranged on an axis concentric with said annuli, said mounting system comprising:
  a. said annuli having confronting raised ridges that interengage each other;
  b. interengaging surfaces of said ridges being formed to lie in planes perpendicular to said axis and intersecting only said interengaging surfaces;
  c. holes for screws interconnecting said annuli being formed in regions spaced between radially inner and radially outer portions of said interengaging surfaces;
  d. said interengaging surfaces extending continuously around the peripheries of said annuli; and
  e. any variation in total width of said inner and outer interengaging surfaces in different sectors of said annuli being less than 50 percent.

18. The mounting system of claim 17 wherein said total widths of said interengagement surfaces are substantially constant around said peripheries.

19. The mounting system of claim 17 wherein said interengagement surfaces are formed on spaced-apart rings.

20. The mounting system of claim 19 wherein said interengagement surfaces are spaced apart by slightly more than the diameters of said holes for said screws.

21. The mounting system of claim 20 wherein said spaced-apart rings are circular and concentric.

22. The mounting system of claim 17 wherein said holes intended to receive heads of said screws are countersunk more than half way into said annuli.

* * * * *